United States Patent
Chianelli et al.

(10) Patent No.: US 8,389,853 B2
(45) Date of Patent: Mar. 5, 2013

(54) ASPHALTENE BASED PHOTOVOLTAIC DEVICES

(75) Inventors: Russell R. Chianelli, El Paso, TX (US); Karina Castillo, Edinburg, TX (US); Vipin Gupta, Las Cruces, NM (US); Ali M. Qudah, El Paso, TX (US); Brenda Torres, El Paso, TX (US); Rajab Emhemed Abujnah, El Paso, TX (US)

(73) Assignees: Board of Regents, The University of Texas System, Austin, TX (US); Sandia Corporation, Albuquerque, NM (US)

( * ) Notice: Subject to any disclaimer, the term of this patent is extended or adjusted under 35 U.S.C. 154(b) by 341 days.

(21) Appl. No.: 12/833,488

(22) Filed: Jul. 9, 2010

(65) Prior Publication Data

US 2011/0005589 A1    Jan. 13, 2011

Related U.S. Application Data

(60) Provisional application No. 61/224,791, filed on Jul. 10, 2009.

(51) Int. Cl.
    *H01L 31/0256* (2006.01)
(52) U.S. Cl. ........... 136/263; 438/85; 136/243; 136/252
(58) Field of Classification Search .................... 438/85
    See application file for complete search history.

(56) References Cited

U.S. PATENT DOCUMENTS

| | | | |
|---|---|---|---|
| 6,479,745 B2 | 11/2002 | Yamanaka et al. | |
| 7,118,936 B2 | 10/2006 | Kobayashi et al. | |
| 7,332,782 B2 | 2/2008 | Tomita | |
| 2004/0211461 A1 | 10/2004 | Murai et al. | |
| 2007/0181178 A1 | 8/2007 | Sohn et al. | |
| 2007/0251574 A1 | 11/2007 | Fujimaki et al. | |
| 2009/0114283 A1 | 5/2009 | Lee et al. | |

OTHER PUBLICATIONS

Rousseau, et al., "Multi-Donor Molecular Bulk Heterojunction Solar Cells: Improving Conversion Efficiency by Synergistic Dye Combinations," Journal of Materials Chemistry, (2009), 19:2298-2300.
Rousseau, et al., "BODIPY Derivatives as Donor Materials for Bulk Heterojunction Solar Cells," Chem. Commun., (2009), pp. 1673-1675.

*Primary Examiner* — Jennifer Michener
*Assistant Examiner* — Jayne Mershon
(74) *Attorney, Agent, or Firm* — Edwin S. Flores; Chalker Flores, LLP

(57) ABSTRACT

Photovoltaic devices and methods of making the same, are disclosed herein. The cell comprises: a first electrically conductive layer; at least one photoelectrochemical layer comprising metal-oxide particles, an electrolyte solution, an asphaltene dye, and a second electrically conductive layer.

17 Claims, 4 Drawing Sheets

ASPHALTENE BASED PHOTOVOLTAIC DEVICES

CROSS-REFERENCE TO RELATED APPLICATIONS

This application claims priority to U.S. Provisional Application Ser. No. 61/224,791 filed Jul. 10, 2009, the entire contents of which is incorporated herein by reference.

TECHNICAL FIELD OF THE INVENTION

The present invention relates in general to the field of photovoltaic devices.

STATEMENT OF FEDERALLY FUNDED RESEARCH

None.

BACKGROUND OF THE INVENTION

Without limiting the scope of the invention, its background is described in connection with the dye-sensitized solar cells.

United States Patent Application No. 20090114283, filed by Lee, et al., is directed to a dye-sensitized solar cell that includes a first substrate, a first electrode layer, a photosensitive dye layer, an electrolyte layer, a second electrode layer, and a second substrate. The first electrode layer is disposed on the first substrate. The photosensitive dye layer is disposed on the first electrode layer. The electrolyte layer is disposed on the photosensitive dye layer, and the electrolyte layer is composed of an organic electrolyte material. The second electrode layer is disposed on the electrolyte layer, and the second substrate is disposed on the second electrode layer. A stable and effective oxidation and reduction reaction is performed between the elements by the characteristics of the composition and the structure of the electrolyte material, thus improving the photoelectric conversion efficiency and the stability of the dye-sensitized solar cell.

United States Patent Application No. 20070251574, filed by Fujimaki, et al., is directed to a dye-sensitized solar cell that includes a first electrode having a photoelectric conversion layer, a second electrode disposed so as to oppose the first electrode, and electrolyte filled at least in between the first electrode and second electrode, the first electrode is constructed with a plurality of first electrode layers disposed superposed in a direction that is opposite the second electrode.

United States Patent Application No. 20040211461, filed by Murai, et al., is also directed to a dye-sensitized solar cell. Briefly, the invention is a dye-sensitized solar cell comprising a semiconductor electrode containing a dye and carboxylic compound, the dye and carboxylic compound being carried on a surface of the semiconductor electrode, a counter electrode, and an electrolyte composition provided between the semiconductor electrode and the counter electrode, and containing an electrolyte that contains iodine and molten salt of iodide.

U.S. Pat. No. 7,332,782, issued to Tomita is directed to a dye-sensitized solar cell with high conversion efficiency. Briefly, the dye-sensitized solar cell has, between an electrode (2) formed on a surface of a transparent substrate (1) and a counter electrode (6), a light-absorbing layer (3) containing light-absorbing particles carrying dye and an electrolyte layer (5), characterized in that the light-absorbing layer (3) containing light-scattering particles (4) different in size from the light-absorbing particles. In such a dye-sensitized solar cell according to the present invention, the energy of light, which passes through a light-absorbing layer in a conventional cell structure, can be strongly absorbed by the dye in the light-absorbing layer of the present invention. This will increase the conversion efficiency and output current of the dye-sensitized solar cell.

U.S. Pat. No. 7,118,936, issued to Kobayashi, et al., is directed to an organic dye-sensitized metal oxide semiconductor electrode and manufacture and organic dye-sensitized solar cells. Briefly, a semiconductor electrode of organic dye-sensitized metal oxide having a semiconductor layer of metal oxide is said to be easily prepared for an organic dye-sensitized solar cell. The semiconductor electrode of organic dye-sensitized metal oxide comprises a substrate having a transparent electrode thereon, a semiconductor layer of metal oxide provided on the electrode and an organic dye absorbed on a surface of the semiconductor layer, the semiconductor layer being formed by a vapor deposition process.

U.S. Pat. No. 6,479,745, issued to Yamanaka, et al., is directed to a dye-sensitized solar cell and method of manufacturing the same. Briefly, the dye-sensitized solar cell comprises a porous semiconductor layer in which a dye is adsorbed and an electrolyte, which are sandwiched between a transparent conductive film formed on a surface of a transparent substrate and a conductive substrate, wherein the electrolyte is retained in a crosslinked polymer compound.

SUMMARY OF THE INVENTION

The present invention describes a photovoltaic device and methods of making a photovoltaic cell comprising: a first electrically conductive layer; at least one photoelectrochemical layer comprising metal-oxide particles, an electrolyte solution and an asphaltene dye; and a second electrically conductive layer. In certain aspects, the present invention can be used to make a novel excitonic device, which does not require the use of an electrolyte.

In one embodiment the present invention is a photovoltaic device comprising a first electrically conductive layer at least one photoelectrochemical layer comprising metal-oxide particles, an electrolyte solution and an asphaltene dye and a second electrically conductive layer comprising one or more conductive elements. In one aspect of the photovoltaic device of the present invention the metal-oxide particles comprise titanium dioxide or other photocatalytic materials optionally dispersed in a surfactant, wherein the surfactants are selected from a group comprising Triton, alkyl polyoxides, alkylphenols, alkyl polyglucosides, fatty alcohols, polysorbates, and other non-ionic surfactants.

In another aspect the one or more conductive elements comprise carbon, graphite, soot, carbon allotropes, or any combinations thereof and the first, second or both electrically conductive layers are flexible metal wherein the first, second of both electrically conductive layers comprises platinum coated indium-tin oxide glass. In yet another aspect the photoelectrochemical layer is defined further as a comprising a semiconductor material and the electrolyte solution comprises iodide salt and iodine. The first electrically conductive layer of the photovoltaic cell of the present invention comprises a photo-sensitized electrode, and the second electrically conductive layer a counter-electrode.

In another embodiment the photovoltaic cell of the present invention comprises a first electrically conductive layer, at least one semiconductor layer comprising asphaltene dye-sensitized titanium dioxide particles in an electrolyte, wherein the electrolyte comprises iodide salt and iodine, and a second electrically conductive layer comprising at least one or more conductive elements, wherein the conductive element comprises soot.

In one aspect the metal-oxide particles comprise titanium dioxide or other photocatalytic materials optionally dispersed in a surfactant selected from a group comprising Triton, alkyl polyoxides, alkylphenols, alkyl polyglucosides, fatty alcohols, polysorbates, and other non-ionic surfactants. In another aspect the one or more conductive elements comprise carbon, graphite, soot, carbon allotropes, or any combinations thereof. The first, second or both electrically conductive layers are flexible metal comprising of platinum coated indium-tin oxide glass. The photoelectrochemical layer of the photovoltaic cell of the present invention is defined further as a comprising a semiconductor material. The electrolyte solution comprises iodide salt and iodine. The first electrically conductive layer comprises a photo-sensitized electrode, and the second electrically conductive layer a counter-electrode.

In yet another embodiment the photovoltaic cell of the present invention comprises a first electrically conductive layer, at least one semiconductor layer comprising a mixture of asphaltene and $CoMoS_2$-sensitized titanium dioxide particles in an electrolyte, wherein the electrolyte comprises iodide salt and iodine and a second electrically conductive layer comprising one or more conductive elements.

In one aspect the asphaltene to $CoMoS_2$ ratio in the mixture is 100:1, 75:1, 50:1, 25:1, 10:1, 5:1, 2:1, or 1:1 and the metal-oxide particles comprise titanium dioxide or other photocatalytic materials optionally dispersed in a surfactant and at least one semiconductor layer comprises a mixture of asphaltene with one or more sulfides are selected from a group comprising $CoMoS_2$, CdS, $Cu_2S$, $NiMoS_2$, $FeMoS_2$, Co, Ni, Fe, Cu and other transition metal sulfides copper indium gallium diselenide, and indium-gallium sulfide. The one or more conductive elements comprise carbon, graphite, soot, carbon allotropes, or any combinations thereof. In another aspect the first, second or both electrically conductive layers are a flexible metal and the first, second of both electrically conductive layers comprises platinum coated indium-tin oxide glass. In yet another aspect the photoelectrochemical layer is defined further as a comprising a semiconductor material and the electrolyte solution comprises iodide salt and iodine. The first electrically conductive layer comprises a photo-sensitized electrode, and the second electrically conductive layer a counter-electrode.

In one embodiment the photovoltaic cell of the present invention comprises (i) a first electrically conductive layer, (ii) at least one semiconductor layer comprising $CoMoS_2$-sensitized titanium dioxide particles in an electrolyte in an electrolyte, wherein the electrolyte comprises iodide salt and iodine, and (iii) a second electrically conductive layer comprising one or more conductive elements. In one aspect the metal-oxide particles comprise titanium dioxide or other photocatalytic materials optionally dispersed in a surfactant and at least one semiconductor layer comprises one or more sulfides selected from a group comprising $CoMoS_2$, CdS, $Cu_2S$, copper indium gallium diselenide, and indium-gallium sulfide. In another aspect the one or more conductive elements comprise carbon, graphite, soot, carbon allotropes, or any combinations thereof and the first, second or both electrically conductive layers are flexible metal.

In another aspect the first, second of both electrically conductive layers comprises platinum coated indium-tin oxide glass. In yet another aspect the photoelectrochemical layer is defined further as a comprising a semiconductor material. In a certain aspect the electrolyte solution comprises iodide salt and iodine. The first electrically conductive layer of the present invention further comprises a photo-sensitized electrode, and the second electrically conductive layer a counter-electrode.

The present invention further describes a method of making a photovoltaic device comprising: depositing at least one photoelectrochemical layer comprising metal-oxide particles, an electrolyte solution and an asphaltene dye, a mixture of asphaltene and a sulfide, one or more sulfides or any combinations thereof on a first electrically conductive layer, and depositing a semiconductor layer on a second electrically conductive layer. In one aspect of the method the metal-oxide particles comprise titanium dioxide or other photocatalytic materials optionally dispersed in a surfactant. In another aspect the one or more sulfides are selected from a group comprising $CoMoS_2$, CdS, $Cu_2S$, $NiMoS_2$, $FeMoS_2$, Co, Ni, Fe, Cu and other transition metal sulfides, copper indium gallium diselenide, and indium-gallium sulfide. In yet another aspect the semiconductor layer comprises carbon, graphite, soot, carbon allotropes, or any combinations thereof and the first, second or both electrically conductive layers are flexible metal.

The first, second of both electrically conductive layers comprises platinum coated indium-tin oxide glass and the photoelectrochemical layer is defined further as a comprising a semiconductor material. The electrolyte solution comprises iodide salt and iodine and the first electrically conductive layer comprises a photo-sensitized electrode, and the second electrically conductive layer a counter-electrode.

The method of the present invention further comprises the steps of forming a roadway comprising the photovoltaic device by: depositing the first electrically conductive layer on a road bed, depositing the at least one photoelectrochemical layer comprising metal-oxide particles, an electrolyte solution and an asphaltene dye a mixture of asphaltene and $CoMoS_2$, $CoMoS_2$ or any combinations thereof on the first electrically conductive layer; and at least partially coating the photoelectrochemical layer with the second electrically conductive layer.

The present invention further describes a photovoltaic device comprising: a first electrically conductive layer, at least one photoelectrochemical layer comprising metal-oxide particles, and an electron donor substance for photon-to-current conversion, and a second electrically conductive layer comprising one or more conductive elements. In one aspect the metal-oxide particles comprise titanium dioxide or other photocatalytic materials optionally dispersed in a surfactant. The electron donor substance comprises asphaltenes, metal sulfides, mixtures of asphaltenes and metal sulfides, Ruthenium or Rhodium-dye complexes, metal free dyes, or any combinations thereof. The device of the present invention further comprises one or more conductive elements comprise carbon, graphite, soot, carbon allotropes, or any combinations thereof. The first, second of both electrically conductive layers comprises platinum coated indium-tin oxide glass, wherein the first electrically conductive layer comprises a photo-sensitized electrode, and the second electrically conductive layer a counter-electrode.

In one embodiment the present invention describes a photovoltaic roadway comprising a first electrically conductive layer on a road bed, at least one photoelectrochemical layer comprising metal-oxide particles, an electrolyte solution and an asphaltene dye, a mixture of asphaltene and $CoMoS_2$, $CoMoS_2$ or any combinations thereof disposed on the first electrically conductive layer, and at least partially coating the photoelectrochemical layer with the second electrically conductive layer, wherein the voltage created between the first and second electrically conductive layers is gathered along the roadway.

BRIEF DESCRIPTION OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1:
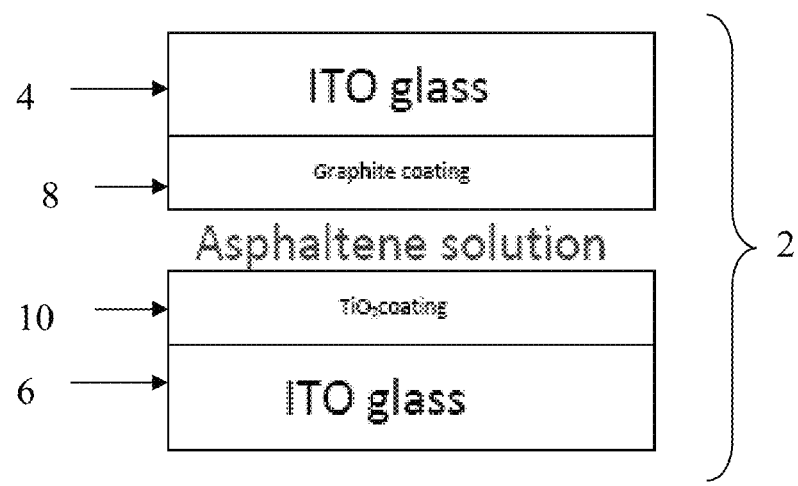
FIG. 1 shows a photovoltaic cell made with asphaltene solution.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

As used herein the "photovoltaic", also abbreviated as (PV), refers to the direct conversion of light energy into electricity. As used herein, the term "photovoltaic device" refers to a complete set of components for converting light energy into electricity by the photovoltaic process. The term "electrically conductive" is used herein to describe a property of a material that involves its ability to transfer electricity.

As used herein the term "asphaltene" refers to a high molecular weight fraction of crude oils that are insoluble in paraffinic solvents. "Asphaltenes" are characterized by a high average molecular weight (about 1000 and up to 5,000) and very broad molecular weight distribution (up to 10,000) and high coking tendency.

The term "surfactant" used herein is intended to include compounds commonly referred to as wetting agents, dispersing agents, and emulsification agents. Typical surfactants include the alkylarylsulfonates, the fatty alcohol sulfates, sodium salt of naphthalenesulfonic acid, alkylaryl polyether alcohols, long chain quaternary ammonium compounds, sodium salts of petroleum-derived alkylsulfonic acids, polyoxyethylene-sorbitan monolaurate, and the like. These dispersing and wetting agents are sold under numerous trademarks and may either be pure compounds, mixtures of compounds of the same general group, or they may be mixtures of compounds of different classes.

The term "semiconductor" in its broadest sense refers to a material that has an electrical conductivity due to flowing electrons (as opposed to ionic conductivity) which is intermediate in magnitude between that of a conductor and an insulator. Semiconductor devices include the various types of transistor, solar cells, many kinds of diodes including the light-emitting diode, the silicon controlled rectifier, and digital and analog integrated circuits.

As used herein, the term "electrolyte solute" refers to a conductive species, such as a salt, which behaves as an electrolyte (i.e., transports an electric current via long-range motion of ions).

The term "photocatalytic material" is used herein to refer to a material exhibiting photocatalysis, that is, the acceleration of a chemical reaction by radiant energy (as light) acting either directly or by exciting a substance that in turn catalyzes the main reaction.

Photovoltaic solar energy works by transforming a fraction of solar radiation into electricity by means of solar cells, which are connected together to form a photovoltaic solar cell module. The solar cells currently on the market are made up of inorganic materials such as silicon. A great deal of research has been aimed at developing solar cells made up of organic (carbon-compound based) semiconductors. Although their performance is still considerably lower than that of cells based on crystalline silicon (around 5% efficiency as compared with 15% for silicon cells), they present numerous advantages. Unlike crystalline silicon, which has to be produced at very high temperatures, they can be manufactured cheaply with low energy cost and environmental impact. Moreover, the fact that they are made using solution processes (for instance from inks or paints) makes it possible to cover large areas and flexible substrates such as films and fabrics. Organic solar cells are not intended to compete with silicon, but rather to be used for specific applications, such as packaging, clothing, flexible screens, and recharging cell phones and laptops. However, in the longer term, they could make a significant contribution to the photovoltaic conversion of solar energy, as long as there is a continuous search for new, more efficient and stable materials.

Over the past ten years or so, most of the research has been focused on developing organic cells in which the active light-absorbing material is made up of long conjugated polymer chains. Although these cells are the most efficient yet discovered, the use of polymers poses a certain number of problems: synthesis, purification, control of the molecular structure and mass, and the distribution of different lengths of chain (polydispersity). In order to overcome these obstacles, Roncali, et al. has developed a novel approach based on replacing polymers by conjugated molecules with a clearly defined structure. Whereas the conversion efficiencies of the initial prototypes published in 2005 were of the order of 0.20%, collaboration between Roncali et al. and Ziessel et al. has recently succeeded in reaching conversion efficiencies of 1.70%, which are among the highest known for this type of cell until now. New classes of active material specifically adapted to such cells are currently being synthesized in the laboratories.

The present invention may also be made as an excitonic device, which does not require the use of an electrolyte. As used herein, the term "exciton" and the devices made thereby refer to a chemical configuration in which an electron is bound to a hole, in this way the exciton can be manipulated within a semiconductor chip to and from a light source, that is, the exciton is formed with light, processed and then converted back into light.

FIG. 1 shows the assembly of a photovoltaic cell 2. Two pieces (4 and 6) of Indium-Tin oxide glass were used as the two electrodes for the assembly of the cell 2. The dimensions of the glass (4 and 6) were 25×25×0.7 mm and they were obtained from Delta's Technologies, Limited. The bottom electrode 6 of Indium-Tin oxide was coated with Degussa 25 $TiO_2$ 10. Degussa 25 $TiO_2$ 10 was mixed with Triton surfactant until the Degussa 25 $TiO_2$ 10 powder was paste like consistency. Then it was spread out on the Indium-Tin oxide glass 6 and dried for 20 min at a 200° C. temperature. It was then cool down and soaked in a solution of asphaltene (1 g)/toluene (50 mL). It was soaked for about 3 h. Then it was pat dried. The top electrode 4 of Indium-Tin oxide was coated with sooth 8. Two electrodes 4 and 6 were sandwiched together as shown in FIG. 1. The two electrodes 4 and 6 were sandwiched together offset one from the other to make the contacts and measure the voltage. Two alligator clips (not shown) were used to keep the two electrodes 4 and 6 together. Then few drops of an electrolyte solution KI-ethylene glycol were added to the edges of the cell 2. The voltage was measured with a standard voltmeter. On a sunny day it gave 0.5 volts and kept producing the same voltage for two weeks.

Figure 2:
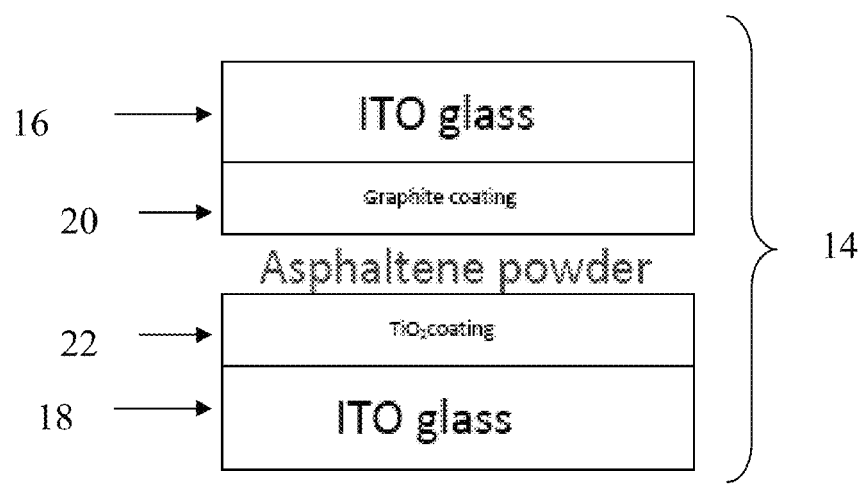
FIG. 2 shows a photovoltaic cell made with asphaltene in the powder form.

FIG. 2 shows the assembly of a photovoltaic cell 14. Two pieces (16 and 18) of Indium-Tin oxide glass were used as the two electrodes for the assembly of the cell 14. The dimensions of the glass were 25×25×0.7 mm and they were obtained from Delta's Technologies, Limited. The bottom electrode 18 of Indium-Tin oxide was coated with Degussa 25 $TiO_2$ 22. Degussa 25 $TiO_2$ 22 was mixed with Triton surfactant until the Degussa 25 $TiO_2$ 22 powder was paste like consistency. Then it was spread out on the Indium-Tin oxide glass 18 and dried for 20 min at a 200° C. temperature. It was allowed to cool down. Asphaltenes (0.001 g) were spread out on the glass. The top electrode 16 of Indium-Tin oxide was coated with sooth 20. Two electrodes 16 and 18 were sandwiched together as shown in FIG. 2. The two electrodes 16 and 18 were sandwiched together offset one from the other to make the contacts and measure the voltage. Two alligator clips (not shown) were used to keep the two electrodes 16 and 18 together. Then few drops of an electrolyte solution KI-ethylene glycol were added to the edges of the cell 14. The voltage was measured with a standard voltmeter. On a sunny day it gave 0.6 volts and kept producing the same voltage for 1 week.

Figure 3:
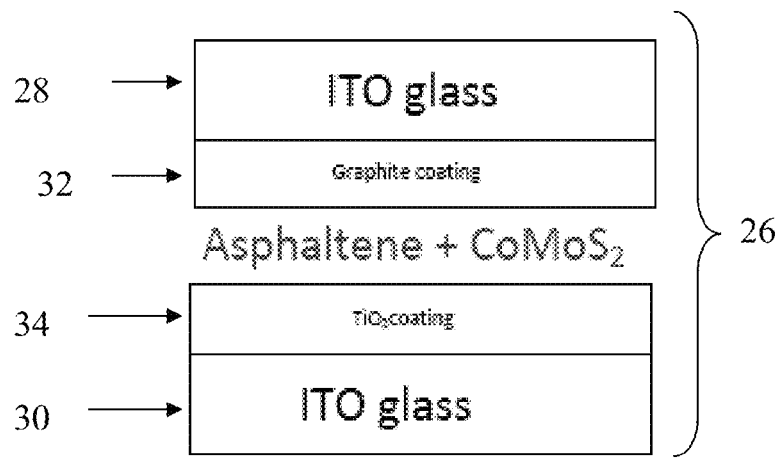
FIG. 3 shows a photovoltaic cell made with a mixture of asphaltene and $CoMoS_2$ in the powder form.

FIG. 3 shows the assembly of a photovoltaic cell 26. Two pieces (28 and 30) of Indium-Tin oxide glass were used as the two electrodes for the assembly of the cell 26. The dimensions of the glass were 25×25×0.7 mm and they were obtained from Delta's Technologies, Limited. The bottom electrode 30 of Indium-Tin oxide was coated with Degussa 25 $TiO_2$ 34. Degussa 25 $TiO_2$ 34 was mixed with Triton surfactant until the Degussa 25 $TiO_2$ 34 powder was paste like consistency. Then it was spread out on the Indium-Tin oxide glass 30 and dried for 20 min at a 200° C. temperature. A mechanical mixture of asphaltene and $CoMoS_2$ was performed in a ratio 10:1. The 0.01 g of the mixture was spread out on the Indium-Tin oxide glass 30 coated with $TiO_2$ 34. The top electrode 28 of Indium-Tin oxide was coated with sooth. Two electrodes 28 and 30 were sandwiched together as shown in FIG. 3. The two electrodes 28 and 30 were sandwiched together offset one from the other to make the contacts and measure the voltage. Two alligator clips (not shown) were used to keep the two electrodes 28 and 30 together. Then few drops of an electrolyte solution KI-ethylene glycol were added to the edges of the cell 26. The voltage was measured with a standard voltmeter. On a sunny day it gave 0.7 volts and kept producing the same voltage for 3 weeks.

Figure 4:
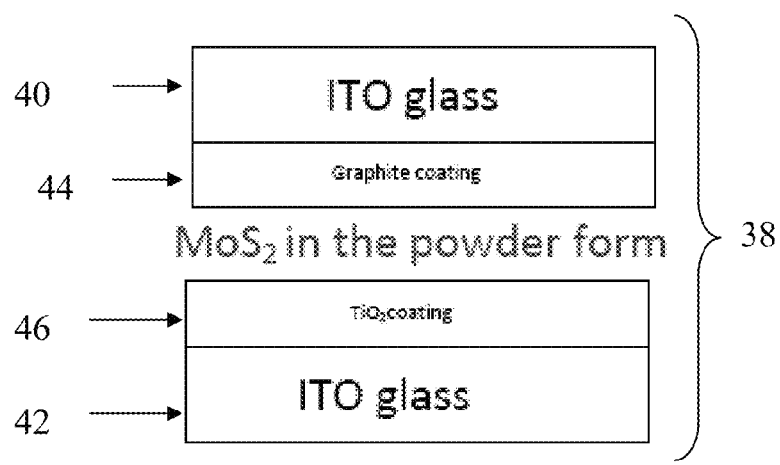
FIG. 4 shows a photovoltaic cell made with $MoS_2$ in the powder form.

FIG. 4 shows the assembly of a photovoltaic cell 38. Two pieces (40 and 42) of Indium-Tin oxide glass were used as the two electrodes for the assembly of the cell 38. The dimensions of the glass were 25×25×0.7 mm and they were obtained from Delta's Technologies, Limited. The bottom electrode of Indium-Tin 42 oxide was coated with Degussa 25 $TiO_2$ 46. Degussa 25 $TiO_2$ 46 was mixed with Triton surfactant until the Degussa 25 $TiO_2$ powder 46 was paste like consistency. Then it was spread out on the Indium-Tin oxide glass 42 and dried for 20 min at a 200° C. temperature. $CoMoS_2$ (0.01 g) was spread out on the Indium-Tin oxide glass 42 coated with $TiO_2$ 46. The top electrode 40 of Indium-Tin oxide was coated with sooth 44. Two electrodes 40 and 42 were sandwiched together as shown in FIG. 4. The two electrodes 40 and 42 were sandwiched together offset one from the other to make the contacts and measure the voltage. Two alligator clips (not shown) were used to keep the two electrodes 40 and 42 together. Then few drops of an electrolyte solution KI-ethylene glycol were added to the edges of the cell 38. The voltage was measured with a standard voltmeter. On a sunny day it gave 0.5 volts and kept producing the same voltage for 1 month.

Figure 5:
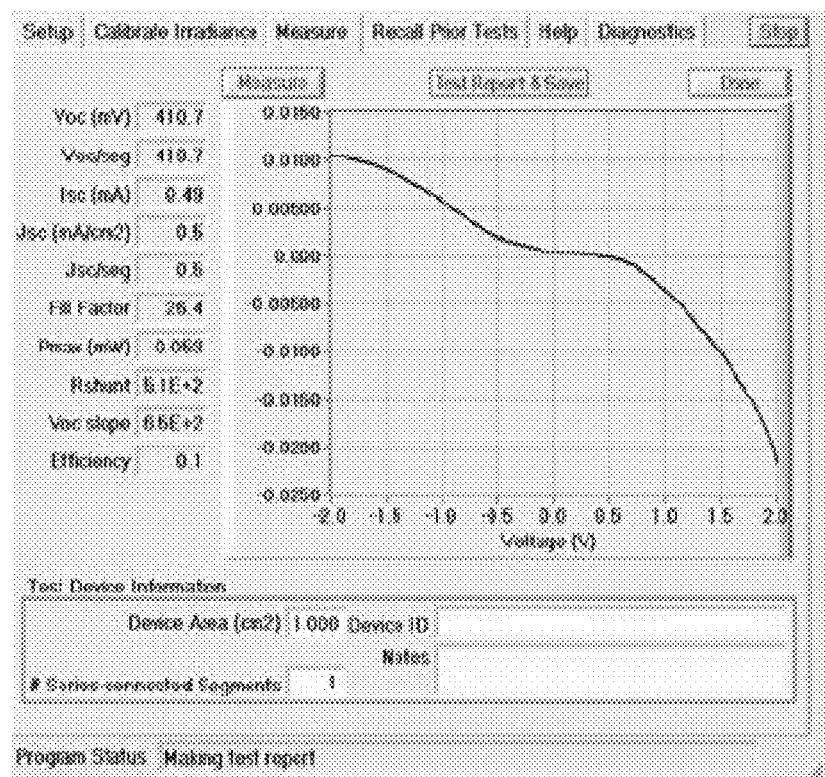
FIG. 5 is a graph of the IV curve of asphalthene solar cell.

IV measurements: The IV measurements were performed using a Peak Power Measuring Device and I-V Curve Tracer for Photovoltaic Module with the following dimensions: 48×16×35 cm. There is a relationship between the current-voltage obtained from solar devices. This relationship is often represented as a graph, between an electric current and a corresponding voltage. These graphs are used to determine the basic parameters of a device and to model its behavior in an electrical circuit. IV measurements were performed on the cells. FIG. 5 shows the graph corresponding to cell 38.

Figure 6:
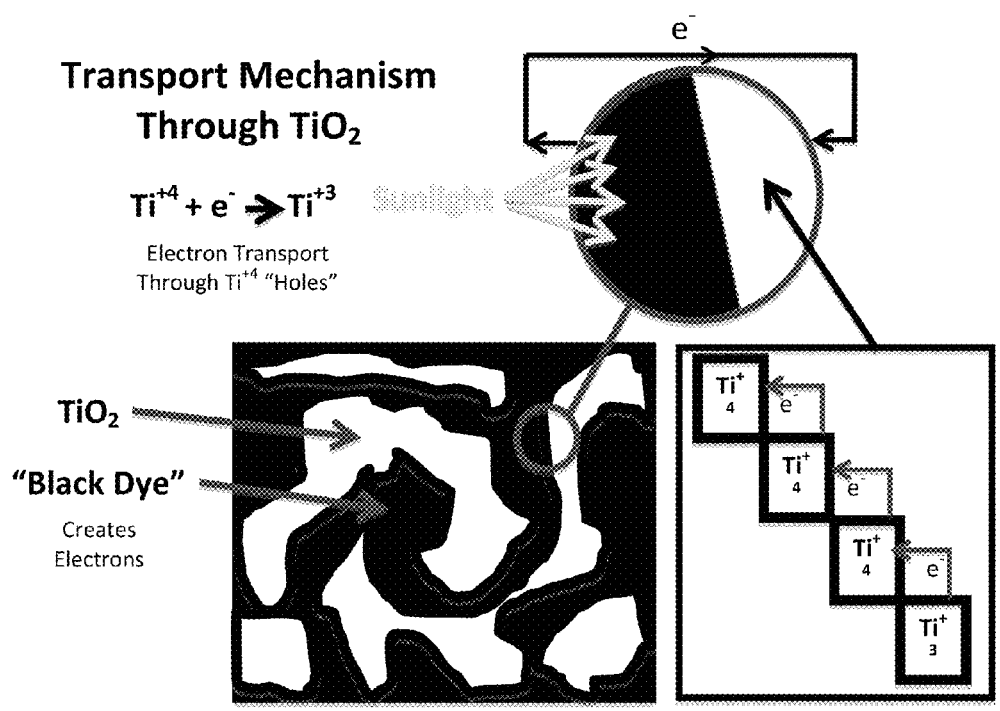
FIG. 6 is a schematic showing the conversion of light energy to electrical energy in an asphaltene containing photovoltaic cell.

FIG. 6 is a schematic representation of the mechanism by which a photovoltaic cell containing asphaltene converts light energy to electrical energy. The sunlight is incident on the photovoltaic cell comprising asphlatene (electron donor) mixed in with the $TiO_2$. The photons are converted into electrons and they move from hole to hole ($Ti^{+3}$ to $Ti^{+4}$). The presence of the asphaltene in the photovoltaic cell of the present invention obviates the necessity of using an electrolyte or electrolyte solution for the transfer of the electrons.

Different organic dyes have been tested for dye sensitized solar cells. It is proposed to use asphaltenes as an organic dye. Asphaltenes have shown to be able to produce voltage. Four different cells were tested. Asphaltene in the liquid and solid form were tested. The cells produce slightly better voltage when the asphaltene is used as a solid. This is maybe due to the fact that in the solid form the asphaltenes are more concentrated that in the liquid form. It has also been observed as the layer of asphaltene is ticker the voltage produced is better. This is contrary to what is usually expected in ordinary dye sensitized cells. It has been reported these cells are coated using a spin coater which provides a really thin coating on the electrodes. Cell #3 was assembled using $CoMoS_2$. It has been reported $MoS_2$ has solar cell applications. However, promoted systems such as $CoMoS_2$ and $NiMoS_2$ have not been reported in the literature. Cell #3 was assembled using $CoMoS_2$ to improve the conductive properties of the asphaltenes. The results show they were improved maybe due to a synergistic effect between the asphaltenes and the catalyst. Cell #4 was assembled using only $CoMoS_2$ and it was really stable as expected. FIG. 5 shows the IV curve of the asphalthene solar cell.

TABLE 1

Results

| Cell # | Assembly | Voltage obtained | Stability of the cell |
|---|---|---|---|
| 1 | ITO glass coated with $TiO_2$. Then the glass was soaked in an asphalthene solution and pat dried. This electrode was assembled with the counter electrode. | 0.5 V | This cell produced voltage for 2 weeks. |
| 2 | ITO glass coated with $TiO_2$ and the asphaltenes were used in powder form. Again this electrode was assembled with a counter electrode. | 0.6 V | This cell produced voltage for a week. |
| 3 | ITO glass coated with $TiO_2$ and a mix of asphaltenes and $CoMoS_2$ in the powder form was used. This electrode was assembled with a counter electrode. | 0.7 V | This cell produced voltage for 3 weeks. |
| 4 | ITO glass was coated with $TiO_2$ and $MoS_2$ in the powder form was used. This electrode was assembled with the counter electrode. | 0.5 V | This cell produced voltage for 1 month. |

The results obtained using asphaltene as light harvesting materials in dye sanitized solar cells are presented in Tables 2-3. Asphaltene used below was hexane extracted asphaltene and the concentration was 0.25-0.5 gram asphaltene/liter toluene. Asphaltene fractionation method used was titration of asphaltene dissolved toluene with pentane till the precipitate started appearing.

indicated in literature, using two layers of TiO2 with different grain sizes, produce cells with higher voltages and currents (Table 4) and leaving the cells one day increase the efficiency.

It is contemplated that any embodiment discussed in this specification can be implemented with respect to any method, kit, reagent, or composition of the invention, and vice versa.

TABLE 2

Results obtained using 0.5 gram asphaltene/liter toluene.

| Asphaltene Fractionation | First precipitate 100 ml pentane | Raw asphaltene in benzene solution | Raw asphaltene in toluene solution | Third | Second | Fourth precipitate 200 ml pentane |
|---|---|---|---|---|---|---|
| Current (mA) | 0.2 | 0.01 | 0.1 | 1.5 | 1.1 | 2 |
| Voltage (mV) | 11.7 | 2.3 | 7.02 | 1.6 | 1.2 | 5.7 |

TABLE 3

Results obtained using 0.25 gram asphaltene/liter toluene.

| Asphaltene Fractionation | First precipitate 100 ml pentane | Raw asphaltene in benzene solution | Raw asphaltene in toluene solution | Third | Second | Fourth precipitate 200 ml pentane |
|---|---|---|---|---|---|---|
| Current (microA) |  |  |  |  | 12 | 4.1 |
| Voltage (mV) |  |  |  |  | 14 | 4.1 |
| Current (microA) |  |  |  | After 1 day |  | 7 |
| Voltage (mV) |  |  |  |  |  | 6.8 |

TABLE 4

Results obtained using two $TiO_2$ layers.

| Asphaltene Fractionation | First precipitate 100 ml pentane | Raw asphaltene in benzene solution | Raw asphaltene in toluene solution | Third | Second | Fourth precipitate 200 ml pentane |
|---|---|---|---|---|---|---|
| Current (microA) |  |  |  |  | 23 |  |
| Voltage (mV) |  |  |  |  | 52 |  |
| Current (microA) |  |  |  | After 1 day | 40 |  |
| Voltage (mV) |  |  |  |  | 273 |  |

The results presented in Tables 2 and 3 indicate that lower asphaltene concentration produces better quality cells. As Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

United States Patent Application No. 20090114283: Dye-sensitized solar cell.

United States Patent Application No. 20040211461: Dye-sensitized solar cell.

U.S. Pat. No. 7,332,782: Dye-sensitized solar cell.

U.S. Pat. No. 7,118,936: Organic dye-sensitized metal oxide semiconductor electrode and its manufacturing method, and organic dye-sensitized solar cell.

U.S. Pat. No. 6,479,745: Dye-sensitized solar cell and method of manufacturing the same.

Multi-donor Molecular Bulk Heterojunction Solar Cells: Improving Conversion Efficiency by Synergistic Dye Combinations. Theodulf Rousseau, Antonio Cravino, Thomas Bura, Gilles Ulrich, Raymond Ziessel and Jean Roncali. Journal of Materials Chemistry. In press, available online.

Bodipy Derivatives as Donor Materials for Bulk Heterojunction Solar Cells. Theodulf Rousseau, Antonio Cravino, Thomas Bura, Gilles Ulrich, Raymond Ziessel and Jean Roncali. Chemical Communication, 19 Mar. 2009.

What is claimed is:

1. A photovoltaic device comprising:
 a first electrically conductive layer comprising a photosensitized electrode;
 at least one photoelectrochemical layer comprising metal-oxide particles, an electrolyte solution and an asphaltene dye, wherein the metal-oxide particles are optionally dispersed in a surfactant; and
 a second electrically conductive layer comprising a counter-electrode, wherein the second electrically conductive layer comprises one or more conductive elements comprising carbon, graphite, soot, carbon allotropes or any combinations thereof.

2. The device of claim 1, wherein the surfactants are selected from a group comprising Triton, alkyl polyoxides, alkylphenols, alkyl polyglucosides, fatty alcohols, polysorbates, and other non-ionic surfactants.

3. The device of claim 1, wherein the first, second or both electrically conductive layers are flexible metal.

4. The device of claim 1, wherein the first, second of both electrically conductive layers comprises platinum coated indium-tin oxide glass.

5. The device of claim 1, wherein the photoelectrochemical layer is defined further as comprising a semiconductor material.

6. The device of claim 1, wherein the electrolyte solution comprises iodide salt or iodine.

7. A photovoltaic cell comprising:
 a first electrically conductive layer comprising a photosensitized electrode;
 at least one semiconductor layer comprising asphaltene dye-sensitized titanium dioxide particles in an electrolyte, wherein the electrolyte comprises iodide salt and iodine; and
 a second electrically conductive layer comprising a counter-electrode, wherein the second electrically conductive layer comprises at least one or more conductive elements.

8. The device of claim 7, wherein the one or more conductive elements comprise carbon, graphite, soot, carbon allotropes or any combinations thereof.

9. The photovoltaic cell of claim 7, wherein the first, second or both electrically conductive layers are flexible metal.

10. The photovoltaic cell of claim 7, wherein the first, second or both electrically conductive layers comprises platinum coated indium-tin oxide glass.

11. A photovoltaic cell comprising:
 a first electrically conductive layer, comprising a photosensitized electrode;

at least one semiconductor layer comprising a mixture of asphaltene and a sulfide sensitized titanium dioxide particles in an electrolyte, wherein the electrolyte comprises iodide salt and iodine; and a second electrically conductive counter-electrode layer comprising one or more conductive elements, wherein the one or more conductive elements comprise carbon, graphite, soot, carbon allotropes or any combinations thereof.

12. The photovoltaic cell of claim 11, wherein the sulfide comprises $CoMoS_2$ and the asphaltene to $CoMoS_2$ ratio in the mixture is 100:1, 75:1, 50:1, 25:1, 10:1, 5:1, 2:1 or 1:1.

13. The photovoltaic cell of claim 11, wherein the at least one semiconductor layer comprises a mixture of asphaltene with a sulfide, wherein the sulfide is selected from a group comprising $CoMoS_2$, CdS, $Cu_2S$, copper indium sulfide, gallium diselenide, and indium gallium sulfide.

14. The photovoltaic cell of claim 11, wherein the first, second or both electrically conductive layers are flexible metal.

15. The photovoltaic cell of claim 11, wherein the first, second or both electrically conductive layers comprises platinum coated indium-tin oxide glass.

16. The device of claim 1 wherein the metal-oxide particles comprise titanium oxide.

17. The device of claim 11, wherein the sulfide comprises CoMoS2 and the asphaltene to CoMoS2 ratio is within a range of 100:1 to 1:1.

* * * * *